United States Patent [19]

Hekimian

[11] 3,878,484

[45] Apr. 15, 1975

[54] OSCILLATOR HAVING OUTPUT FREQUENCY LINEARLY RELATED TO RESISTANCE

[75] Inventor: Norris C. Hekimian, Rockville, Md.

[73] Assignee: Hekimian Laboratories, Inc., Rockville, Md.

[22] Filed: Jan. 11, 1974

[21] Appl. No.: 432,458

[52] U.S. Cl. ................ 331/143; 328/127; 328/181; 331/135; 331/61

[51] Int. Cl. ............................................. H03k 4/56

[58] Field of Search ............. 331/61, 108, 135, 136, 331/143, 111; 328/127, 181, 185; 307/261

[56] References Cited

UNITED STATES PATENTS

| | | | |
|---|---|---|---|
| 3,206,673 | 9/1965 | Hooker et al. | 331/61 |
| 3,388,345 | 6/1968 | Towner | 331/136 |
| 3,396,347 | 8/1968 | Richman et al. | 331/136 |
| 3,581,238 | 5/1971 | Shimemura | 331/136 |

*Primary Examiner*—John Kominski
*Attorney, Agent, or Firm*—Rose & Edell

[57] ABSTRACT

An oscillator includes an operational integrator, a Schmitt trigger, and an operational amplifier connected in series and in a closed feedback loop. The oscillator frequency is directly proportional to the resistance in the negative feedback path of the operational amplifier. The oscillator is ideally suited as a tone generator in a musical instrument wherein the amplifier feedback resistance is changed as each key switch is actuated. The oscillator is also disclosed for use as an ohm meter whereby a resistance to be measured is placed in the amplifier feedback path and the corresponding oscillator frequency is monitored as a measure of the resistance.

14 Claims, 3 Drawing Figures

OSCILLATOR HAVING OUTPUT FREQUENCY LINEARLY RELATED TO RESISTANCE

BACKGROUND OF THE INVENTION

The present invention relates to variable frequency oscillators and, more particularly, to a variable frequency oscillator in which the frequency varies linearly with respect to a resistance.

In monophonic electronic musical instruments, it is common to provide a single oscillator which can be selectively keyed to provide output tones corresponding to those contained within one or more octaves. The usual approach is to provide a string of resistors which can be selectively switched into or out of the circuit upon actuation of various key switches. The value of resistance in the circuit at any time determines the oscillator frequency, and the relationship between frequency and resistance follows a square law function. Examples of such oscillators may be found in U.S. Pat. Nos. 2,933,699 to Bonham and 2,545,023 to Ellefson. The square root relationship between resistance and frequency requires a greater range of resistance values to achieve a given frequency range than would be the case if the frequency were linearly related to resistance. As a practical matter, too wide a range of resistance values often will cause an amplifier or other circuit to operate outside of the optimum portion of its operating characteristic, so that the frequency range of the oscillator may be limited. In addition, the square root relationship between frequency and resistance renders the initial set up and design of the oscillator more complex than would be the case for a linear relationship.

It is therefore a primary object of the present invention to provide a variable frequency oscillator in which the frequency is directly proportinal to the resistance of an oscillator component.

It is another object of the present invention to provide an oscillator suitable for use as a tone generator in a monophonic electronic musical instrument wherein actuation of one or more simulated valves varies a resistance which controls the frequency of the oscillator as a linear function of the resistance.

It is another object of the present invention to provide an oscillator circuit suitable for use as a tone generator in an electronically-simulated wind instrument.

An oscillator having a frequency which varies linearly with the resistance of an oscillator component is also valuable in an ohmmeter circuit. Conventional ohmeters are usually ammeters connected in series with the resistance being measured and a constant voltage source. Because the current through the ammeter varies inversely with the measured resistance the ohm scale on the meter is not linear but instead compresses substantially at one end. Accuracy of measurement at that end of the scale is often poorer than at the opposite end of the scale.

It is therefore an object of the prsent invention to provide an oscillator in which the frequency varies linearly with a resistance being measured, whereby the frequency can be monitored as a measure of the resistance.

SUMMARY OF THE INVENTION

According to the present invention a variable frequency oscillator includes an operational integrator, a Schmitt trigger and an operational amplifier connected in a series in a closed feedback loop. The gain of the operational amplifier is linearly proportional to its negative feedback resistance. The amplifier gain determines the initial input conditions for the integrator during each half cycle so that the integrator output signal charges or discharges to the Schmitt trigger threshold levels within a time interval determined by the operational amplifier gain. Linear variation of the gain in response to vartiation of the amplifier feedback reesistance thus produces a correspondingly linear variation in oscillator frequency.

When used as a tone generator for an electronically-simulated musical instrument, the oscillator may employ multiple key switches, each connected in series with a resistor of value chosen to produce the desired frequency. The key-switch and resistor combinations are connected in parallel across the feed-back resistor for the operational amplifier so that actuation of each key switch produces a different tone. The key switches are actuated by keys or valves of the type employed in the musical instrument being simulated. Alternatively, the feedback resistor for the amplifier may include a linear potentiometer linked to the slide of a simulated slide trombone or similar musical instrument having a tone controller adjustable over a continuous range.

In another embodiment the amplifer feedback resistor takes the form of a resistance to be measured. The oscillator frequency can then be measured to provide a measured resistance indication which varies linearly with resistance.

BRIEF DESCRIPTION OF THE DRAWINGS

The above and still further objects, features and advantages of the present invention will become apparent upon consideration of the following detailed description of specific embodiments thereof, especially when taken in conjunction with the accompanying drawings, wherein.

DESCRIPTION OF THE PREFERRED EMBODIMENTS

Figures 1, 2, 3:
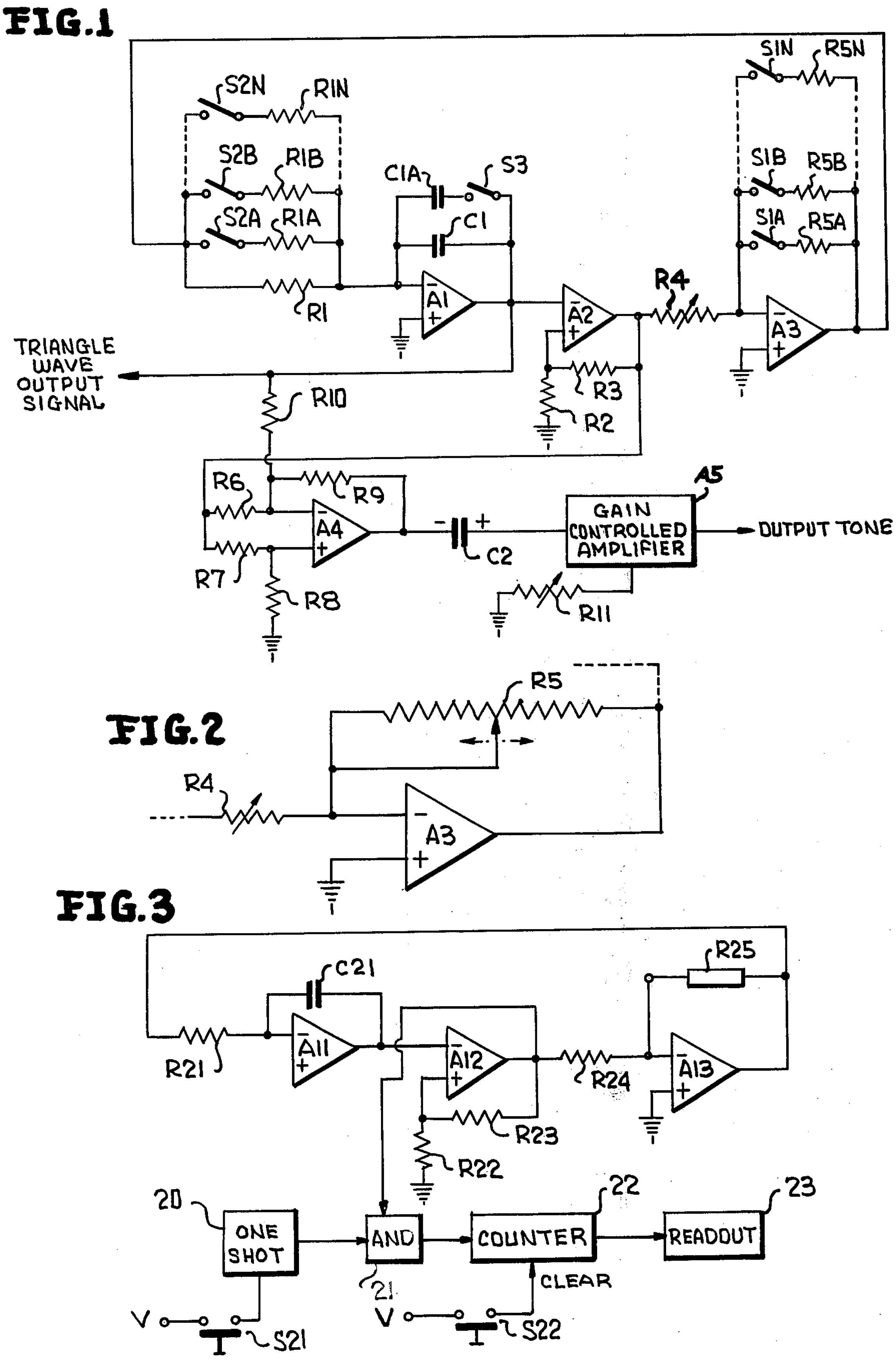
FIG. 1 is a schematic diagram of the oscillator of the present invention employed as a tone generator in an electronic musical instrument.
FIG. 2 is a schematic diagram of one portion of the circuit of FIG. 1, modified in accordance with one aspect of the present invention.
FIG. 3 is a schematic diagram of the oscillator of the present invention employed as a linear ohmmeter.

Referring specifically to FIG. 1 of the accompanying drawings, three circuits including operational amplifiers A1, A2, and A3, respectively, are connected in series in a closed feedback loop. The amplifiers are of the differential type having inverting (−) and non-inverting (+) input terminals and an output terminal. The input impedance of the amplifiers is very large, the output impedance is very small, and the gain is relatively high.

The circuit associated with amplifier A1 is an operational integrator and includes an input resistor R1 connected in series with the (−) input terminal of amplifier A1. An integrating capacitor C1 is connected between the output terminal and (−) input terminal of amplifier A1. The (+) input terminal of amplifier A1 is connected to ground. As thus described, the integrator circuit is a conventional operational integrator having a time constant defined by resistor R1 and capacitor C1. The output signal provided at the output terminal of amplifier A1 is phase inverted from the input signal applied to the (−) input terminal of that amplifer; that is, the output signal is shifted 180° relative to the input signal.

The circuit associated with amplifier A2 is a Schmitt trigger circuit in which the (−) input terminal of amplifier A2 is connected to the output terminal of amplifier A1. The (+) input terminal of amplifier A2 is referenced to ground through resistor R2. A positive feedback resistor R3 is connected between the output terminal and (+) input terminal of amplifier A2. As thusly connected, high gain amplifier A2 operates as a Schmitt trigger. More particularly, if the input signal applied to the (−) input terminal becomes more positive than the signal at the (+) input terminal, the amplifier output signal becomes highly negative. The fedback negative signal at the (+) input terminal reinforces the negative output signal state. If the signal at the (−) input terminal of amplifier A2 becomes negative relative to the signal at the (+) input terminal, the output signal becomes highly positive and the fedback signal reinforces this positive output signal state.

The circuit associated with amplifer A3 is a high gain operational amplifier circuit and includes a variable resistor R4 connected between the output terminal of A2 and the (−) input terminal A3. The (+) input terminal of amplifier A3 is grounded. A feedback circuit including parallel resistors R5A, R5B---R5N, is connected in series with respective switches S1A, S1B---S1N, is connected from the output terminal to the (−) input terminal of amplifier A3. The gain of amplifier A3 is proportional to the value of the in-circuit feedback resistance (i.e., R5A---R5N) divided by the value of R4, as is well known for operational amplifiers. The output terminal from amplifier A3 is connected back to resistor R1 through which it is coupled to the (−) input terminal of amplifier A1.

The circuit of FIG. 1 as thus far described is an oscillator. More particularly, assume the output signal from amplifier A2 is initialy positive. This positive signal level is applied to amplifier A3 where a phase inversion takes place, resulting in a negative signal level being applied through resistor R1 to the (−) input terminal of amplifier A1. Capacitor C1 beings to charge so that the voltage at the output terminal of amplifier A1 becomes more positive. When this voltage becomes more positive than the voltage at the (+) input terminal of amplifier A2 (with due consideration for offset), amplifier A2 switches state to provide a highly negative level at its output terminal, thereby changing state from the assumed initial condition. This highly negative level is applied to operational amplifier A3 so that a positive level is applied through resistor R1 to the (−) input terminal of amplifier A1. Capacitor C1 charges toward this positive level, driving the output voltage from amplifier A1 more negative. When the output voltage from amplifier A1 becomes more negative than the voltage at the (+) input terminal of amplifer A2, amplifier A2 switches state to provide a highly positive output signal. A full cycle has thus been completed with the output signal from amplifier A2 starting at a highly positive level, switching at mid-cycle to a highly negative level, and returning to the high positive level. This singal provided at the output terminal of amplifier A2 is a square-wave having a frequency which is the basic frequency of the oscillator. The output signal from amplifier A1, on the other hand, is a triangular wave having a frequency which is dependent upon the time constant determined by capacitor C1 and resistor R1, the amplitude of the square wave supplied by amplifier A3, and the threshold levels of Schmitt trigger A2.

As mentined previously, the gain of amplifier A3 is directly proportional to the in-circuit feedback resistance R5A, R5B---R5N. In order to take advantage of this linear relationship in a tone generator for a musical instrument, each switch S1A, S1B---S1N corresponds to a key switch for the instrument. The switches are normally open and are selectively actuable, upon actuation of the respective keys of the musical instrument, to place one of the resistors R5A through R5N in the negative feedback path around amplifier A3. The key switch which is actuated thus determines the gain of amplifier A3. The gain of amplifier A3 determines the level of the signal applied to the resistor R1 in the integrator circuit. The level applied to the integrator in turn determines how quickly the integrator will charge to the threshhold level of the Schmitt trigger. Thus the gain of amplifier A3, which itself is a linear function of the negative feedback resistance across amplifier A3, is linearly related to the frequency of the oscillator. It is therefore possible to select values of resistors R5A, R5B---R5N to achieve the proper relationship between the notes in the musical scale. The relationship between these resistors and the frequency is linear so that, for example, if key switch S1N is intended to produce a note which is one octave higher than that produced by key switch S1A, resistor R5N would have twice the resistance of resistor R5A. Depending upon the number of key switch-resistor resistor combinations employed, a multi-octave frequency range may be produced for the oscillator in FIG. 1.

The output signal for the circuit may either be the square wave produced at the output terminal of amplifier A2 or the triangle wave signal produced at the output terminal of amplifier A1. If the square wave provided by the Schmitt trigger (amplifier A2) is employed, different harmonic components of that square wave may be selectively filtered out to achieve the desired tone color. Likewise, other wave shaping techniques known in the electronic music art may be utilized to achieve tone color effects.

Utilization of the triangle wave output signal from the operational integrator (amplifier A1) facilitates simulation of a woodwind instrument. As illustrated in FIG. 1, the output signal from amplifier A1 is coupled through resistor R10 to the (−) input terminal of operational amplifier A4. Likewise, the output signal from amplifier A2 is coupled through resistor R7 to the (−) input terminal of amplifier A4, and through resistor R7 to the (+) input terminal of amplifier A4. The latter input terminal is also coupled to ground through resistor R8. A negative feedback resistor R9 is coupled between the output terminal of amplifier A4 and the (−) input terminal of that amplifier. The output signal of amplifier A4 is also coupled through capacitor C2 to a gain controlled amplifier A5 to provide the output tone for the circuit. The gain control mechanism for amplifier A5 is schematically illustrated as variable resistor R11. In actual practice R11 may be a resistance which is varied in response to the force acting to cause contact between two members. For example, if the circuit of FIG. 1 is to be used in the simulation of a clarinet, the force of the breath exerted by the musician controls the resistance R11 and thereby the gain of amplifier A5. The volume of the output tone is therefore rendered responsive to how hard the musician blows into the instrument. If the musician does not blow into the instrument, amplifier A5 is cut off. The circuit associated with amplifier A4 effectively amplifies and shapes the trinagular wave output signal of amplifier A1 to provide an output tone which is closely simulative of the tone of a clarinet.

Further flexibility for the electronic tone generator of FIG. 1 may be achieved by placing resistor-key switch combinations in parallel with resistor R1. Specifically, key switch S2A, S2B, . . . S2N is placed in series with a respective resistor, R1A, R1B, . . . R1N. Depending upon which, if any, of the switches S2A through S2N are closed, the resistive portion of the integrator time constant is changed. By properly selecting the values of resistors R1A through R1N, actuation of each of switches S2A through S2N may change the frequency of the oscillator by one whole octive. This of course, is achieved simply by changing the time constant of the integrator by a factor of two for each octave changed.

Still further flexibility may be achieved by placing a capacitor C1A and switch S3A in series, the combination connected in parallel with integrator capacitor C1. If the capacitance of C1A is selected to be approximately 16 percent of capacitor C1, actuation of switch S3 changes the tone pitch one-half note.

The parallel connections of resistors R5A through R5N is of course only one possible connection. These resistors may also be connected in series across A3, in which case the key switches would be effective to switch one or more of the resistors into the circuit.

Although resistance R4 is illustrated as being variable, this is not necessary for the present invention. The circuit frequency is inversely proportinal to the value of R4 so that this resistance can serve as a frequency trim or adjustment mechanism. Thus the oscillator may be tuned to other instruments or to a standard pitch device.

Alternatively, R4 may be used as the main tone controling device. For example, in some cases it may be desirable to control the frequency of the oscillator in accordance with the position of a single member rather than by the actuation of multiple key switches. As an illustration, in a slide trombone the output tone is determined by the position of the slide valve. In addition the feedback resistor for amplifier A3 may be modified for this purpose. Referring to FIG. 2 of the accompanying drawings, the operational amplifier portion of the circuit of FIG. 1 is shown modified to the extent that resistors R5A---R5N are replaced by a potentiometer R5 in which the slider arm is mechanically linked to the slide valve in an electronically simulated slide trombone. The gain of the amplifier A3 is linearly related to the position of the slider arm in the potentiometer and the gain of amplifer A3, as described above, is linearly related to the frequency of the oscillator. Thus by replacing the operational amplifier circuit of FIG. 1 with the operational amplifier circuit of FIG. 2, with like elements being substituted for like elements, a tone generator with a continuous and linear tone control is produced.

The oscillator of the present invention also has particular utilization as a linear ohm meter. This form of the invention is illustrated in FIG. 3 of the accompanying drawings wherein amplifiers A11, A12, and A13 correspond to amplifiers A1, A2 and A3 of FIG. 1. Likewise resistors R21 through R25 correspond to resistors R1 through R5, respectively of FIG. 1. Capacitor C21 in FIG. 3 corresponds to capacitor C1 in FIG. 1. The oscillator operates in the same manner as described above in relation to FIG. 1 whereby the value of resistor R25 is linearly related to the output frequency of the oscillator. In this case resistor R25 is an unknown resistance to be measured.

A one-shot multi-vibrator 20 is arranged to be selectively actuated upon momentary closure of start switch S21. Once activated, one-shot 20 provides an output pulse of predetermined duration. This pulse is applied to AND gate 21 along with the output signal from amplifier A12 (or, alternatively, the output signal from amplifier A11). The output signal from AND gate 21 is applied to counter 22 which in turn feeds a visual readout device 23 at which the current count in counter 22 appears. A clear signal is applied to counter 22 by momentary actuation of reset switch S22.

When it is desired to make resistance measurement with the circuit of FIG. 3, the unknown resistance R25 is placed across the output and (−) input terminals of amplifier A13. Reset switch S22 is depressed to clear counter 22 and then start switch S21 is depressed. One-shot 20 provides a pulse of known duration to AND gate 21 which during that pulse duration permits the triangular or square wave signals from the oscillator to be counted by counter 22. At the termination of the one-shot interval counting terminates and the final count in the counter may be read-out at read-out unit 23. This read-out may be arranged to be directly in ohms by appropriately pre-setting counter 22 in accordance with a specified calibration scheme. Alternatively, the read-out from unit 23 may be compared to a read-out versus resistance calibration chart from which the resistance of resistor R25 may be determined.

The importance of the circuit of FIG. 3 resides in the fact that it permits resistance to be measured with a readout which is a linear function of the measured resistance. this of course is made possible by the fact that the frequency of the oscillator in FIG. 3 is linearly related to resistor R25. Not only is the circuit linear and therefore easier to use and more accurate, it is also inexpensive since the components, except for the readout unit 23, may be fabricated from integrated circuits.

Although by no means limiting on the scope of the present invention, an actual oscillator constructed in accordance with the principles of the present invention was tested and operated successively, providing a linear relationship between the output frequency and variations in resistor R5; when the following components were employed:

| Component | | Valve |
|---|---|---|
| R1 | | 51K ohms |
| R2 | | 10K ohms |
| R3 | | 91K ohms |
| R4 | | 10K pot in series with 47K ohms |
| R5 | (variable) | 120 ohms 47K ohms |
| C1 | | .01 uf. |

I have thus provided an oscillator in which the output frequency is directly proportional to the resistance of a variable resistor in the circuit. The oscillator has utilization in a number of areas, particularly as an electronic music tone generator and a linear digital ohm meter. These particular utilizations of my novel oscillator are not to be construed as limiting upon the scope of the present invention.

In the Schmitt trigger portion of the oscillator, it is the hysteresis effect, produced by the positive feedback circuit (R3, R2) which permits generation of the triangular wave at the output terminal of the integrator (A1, A11). Specifically, instead of there being one threshold level for triggering the Schmitt trigger, as would be the case if there were no feedback (and hence no hysteresis) in the operational amplifier (A2, A12), there are in effect two triggering threshold levels. One level is positive and the other is negative. The output signal from the integrator is thus permitted to charge between these levels before the Schmitt trigger changes stage and changes the polarity of the level toward which the integrator charges.

While I have described and illustrated specific embodiments of my invention, it will be clear that variations of the details of constructin which are specifically illustrated and described may be resorted to without departing from the true spirit and scope of the invention as defined in the appended claims.

I claim:

1. An oscillator including a closed loop circuit having a net phase shift which is an odd multiple of 180° around said loop, said oscillator comprising:

A Schmitt trigger of the type having means for establishing first and second threshold levels, an input terminal, and an output terminal for providing a signal at a first output level when the signal amplitude at said input terminal rises above said first threshold level and at a second output level when the signal amplitude at said input terminal falls below said second threshold level;

a first operatinal amplifier including an input terminal, an output terminal, a resistive negative feedback path connected between said output and input terminals of said amplifier, a gain which is linearly related to the resistance of said negative feedback path, and resistive means coupling the signal from the output terminal of said Schmitt trigger to the input terminal of said amplifier; and an integrator circuit including input means for receiving signal from the output terminal of said amplifier and output means for providing an output signal which corresponds to the integral of the signal received by said input means and for applying said output signal to the input terminal of said Schmitt trigger:

wherein the output signal provided by said integrator circuit has a substantially triangular waveform with waveform transistions occuring at said first and second threshold levels.

2. The oscillator according to claim 1 wherein said resistive negative feedback path for said operatinal amplifier comprises a plurality frequency-determinative circuits connected in parallel between the output and input terminals of said operational amplifier, each frequency determinative circuit comprising a switch and a resistor connected in series.

3. The oscillator according to claim 2 employed as a tone generator for a musical instrument and wherein said switches are normally open and the resistances of said frequency-determintive circuits are related in the same manner as the notes of a musical scale.

4. The oscillator according to claim 1 wherein said resistive negative feedback path includes an adjustable resistance.

5. The oscillator according to claim 1 wherein said resistive negative feedback means comprises a potentiometer connected between said output and input terminals of said operational amplifier.

6. The oscillator according to claim 1 employed as an ohmmeter, wherein the resistive negative feedback path for said operational amplifier is a resistance to be measured, and further comprising means for measuring the frequency of said oscillator when said resistance to be measured is connected between the output and input terminals of said operational amplifier.

7. The oscillator according to claim 1 wherein said Schmitt trigger comprises: a second operational amplifier having an inverting input terminal corresponding to the Schmitt trigger input terminal, a non-inverting input terminal, and an output terminal corresponding to the output terminal of said Schmitt trigger; and a voltage divider connected between said output terminal of said second operational amplifier and ground with a voltage division point on said voltage divider connected to said non-inverting input terminal.

8. The oscillator according to claim 7 wherein said resistive negative feedback path for said operational amplifier comprises a plurality frequency-determinative circuits connected in parallel between the output and input terminals of said operational amplifier, each frequency determinative circuit comprising a switch and a resistor connected in series.

9. The oscillator according to claim 7 employed as an ohmmeter, wherein the resistive negative feedback path for said operational amplifier is a resistance to be measured, and further comprising means for measuring the frequency of said oscillator when said resistance to be measured is connected between the output and input terminals of said operational amplifier.

10. The oscillator according to claim 7 wherein said integrator circuit comprises an operational integrator including: a third operational amplifier with an inverting input terminal and an output terminal; a capacitor connected between the output and inverting input terminals of said third operational amplifier; and a resistor connected in series between said first operational amplifier and the inverting input terminal of said third operational amplifier.

11. The oscillator according to claim 10 wherein said resistive negative feedback path for said opertional amplifier comprises a plurality frequency-determinative circuits connected in parallel between the output and input terminals of said operational amplifier, each frequency determiniative circuit comprising a switch and a resistor connected in series.

12. The oscillator according to claim 10 employed as an ohmmeter, wherein the resistive negative feedback path for said operational amplifier is a resistance to be measured, and further comprising means for measuring the frequency of said oscillator when said resistance to be measured is connected between the output and input terminals of said operational amplifier.

13. An oscillator having a frequency which is variable over a known frequency range, said oscillator comprising:

an integrator having an input terminal and an output terminal;

a Schmitt trigger circuit having an input terminal and an output terminal;

an operatinal amplifier having an input terminal and an output terminal, said operational amplifier including a resistive negative feedback path and means for controllably varying the gain of said operational amplifier by selectively varying the resistance of said negative feedback path;

means connecting the output terminal of said operational amplifier to the input terminal of said integrator;

means connecting the output terminal of said integrator to the input terminal of said Schmitt trigger; and means connecting the output terminal of said Schmitt trigger to the input terminal of said operational amplifier.

14. An oscillator comprising:

an integrator including: a first phase-inverting operational amplifier having an input terminal and an output terminal; input resistor means for coupling signal to said input terminal; and capacitor means connected in negative feedback relationship between said output and input terminals;

A schmitt trigger circuit including: a second phase-inverting operational amplifier having inverting and non-inverting input terminals and an output terminal; a resistive positive feedback path connected between the output and non-inverting input terminals of said second amplifier; and a resistive reference path connected between the non-inverting input terminal of said second amplifier and a source of reference potential;

means coupling the output terminal of said first amplifier to the inverting input terminal of said second amplifier;

a third phase-inverting operational amplifier having input and output terminals, a resistive negative feedback path connected between said output and input terminals of said third amplifier; resistive coupling means connected between the output terminal of said second amplifier and the input terminal of said third amplifier;

means connecting the output terminal of said third amplifier to the input terminal of said first amplifier through said input resistor means; and means for controllably varying the frequency of said oscillator by varying the resistance of said resistive negative feedback path for said third amplifier.

* * * * *